Sept. 7, 1954 F. H. STITES ET AL 2,688,664
WIDE RANGE PULSE AMPLIFIER
Filed July 2, 1951
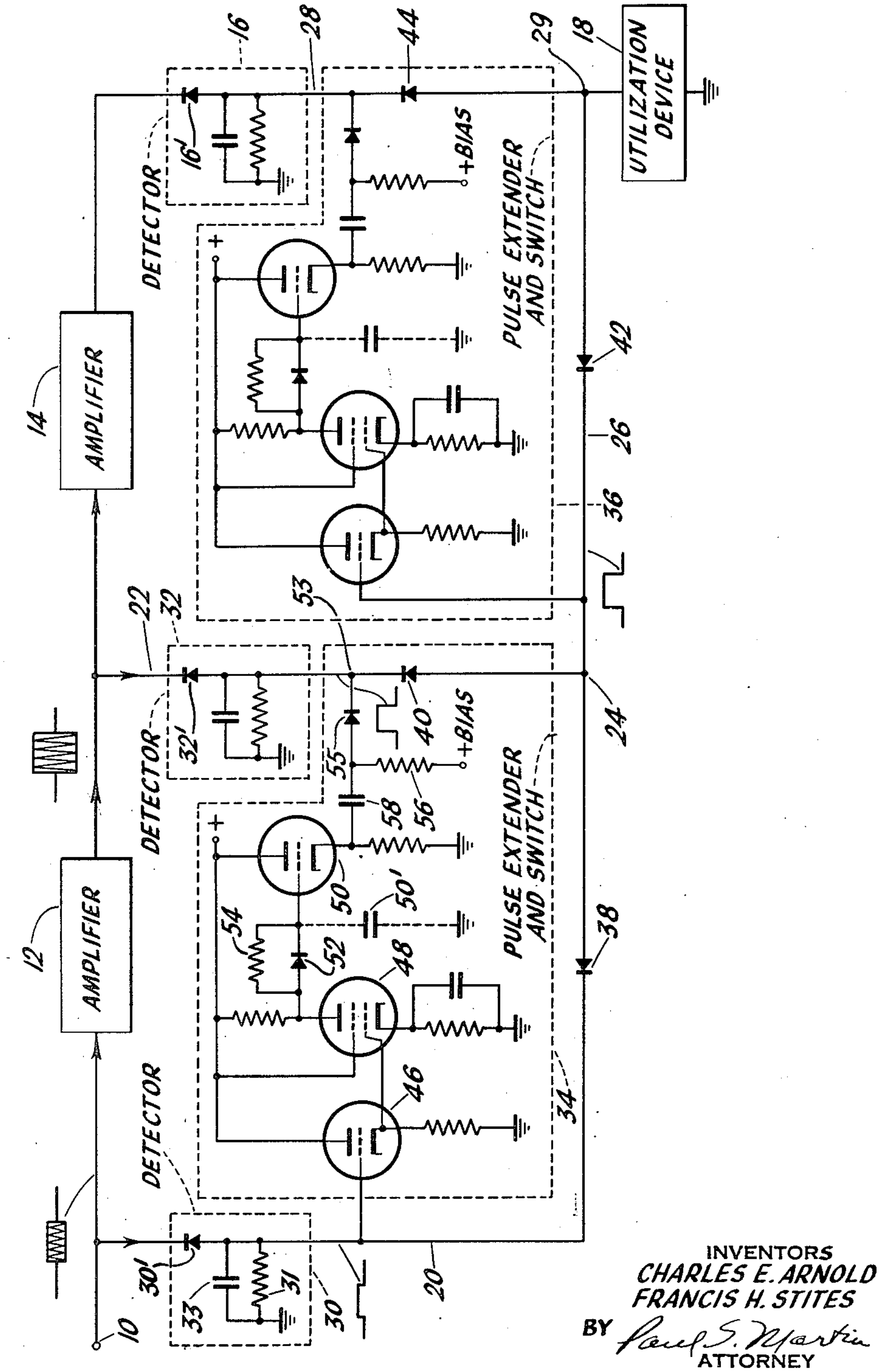
INVENTORS
CHARLES E. ARNOLD
FRANCIS H. STITES
BY Paul S. Martin
ATTORNEY Patented Sept. 7, 1954 2,688,664

UNITED STATES PATENT OFFICE 2,688,664

WIDE RANGE PULSE AMPLIFIER

Francis H. Stites, Wayland, and Charles E. Arnold, Milton, Mass., assignors to Sylvania Electric Products Inc., a corporation of Massachusetts Application July 2, 1951, Serial No. 234,692

8 Claims. (Cl. 179—171)

The present invention relates to electrical amplifiers, and in particular to amplifiers particularly intended for amplification of pulses.

High gain amplifiers are frequently used to boost the level of pulse signals from very low input strength to greater output strength. When it is desired to allow such amplifiers to remain unattended but it is also required that the amplifier should translate signals of both weak input level and comparatively high input level, some form of automatic gain control is desirable. Usually automatic gain controls depend upon taking the average level of input signals after suitable amplification and applying this as a control voltage to variable-gain amplifier stages. This averaging process commonly requires a circuit having a long time constant. With such gain control arrangement used in pulse amplifiers, the output as a control voltage depends upon the ratio of the pulse duration to the pulse interval and not solely on the pulse amplitude. Furthermore, the amplifier response changes slowly so that pulse sequences of high level having low level pulses interspersed are either excessively amplified for the high level portions or inadequately amplified for the low pulse sequence. This type of action occurs for example, in transponder beacons where high level radar pulses and low level radar pulses may be received in random sequence.

In one aspect the present invention has as an object the provision of an amplifier of rapid response characteristics, that is, one whose gain is quickly automatically adjusted to suitably amplify a pulse of any input level over a wide range of input levels to a reasonably constant output level. A more general aspect resides in the provision of an automatic gain control system for an amplifier having rapid response characteristics.

Where pulses are to be amplified, it sometimes is considered proper to amplify all signals, including weak signals close to the general noise level, sufficiently to cause limiting in the amplifier, and to dispense with automatic gain control entirely. In such an arrangement the weak signals are sufficiently amplified for utilization, and the stronger signals are excessively amplified but are limited so as to have an output amplitude corresponding (within a reasonable latitude) to the level to which weak signals are amplified. Such a system introduces serious difficulties where the duration of the pulse is of significance. As an inherent attribute, amplifiers which operate to limit a pulse tend to extend or increase the duration of the pulse, comparing duration of the pulse output to that of the pulse input. Where a pulse is repeatedly impressed upon cascaded amplifier stages in each of which a strong pulse is limited and therefore limited successively, the resultant output pulses are seriously extended, compared to the input pulse width.

Accordingly, a further object of this invention resides in the provision of an amplifier capable of translating input pulses of widely different levels to an output level suitable for utilization without, however, extending the pulse widths irrespective of their input levels. More generally, the object of the present invention is to provide an improved wide-range amplifier especially intended for amplification of pulse type signals.

In the illustrative embodiment of the invention described in detail below, an amplifier including a cascade of amplifier stages is provided with a multiplicity of signal diversion paths; and these paths are associated with switch units whose function is to interrupt signal transmission from any succeeding amplifier stage when signals of the desired order of magnitude are available at any one such diversion path. All of the diversion paths are coupled to the output point to which the output of the final stage of cascaded amplifiers is also coupled.

The illustrative embodiment is shown in the accompanying drawing which is a wiring diagram thereof, partly in block diagram form.

In the drawing, the input signal is applied between input terminal 10 and ground and may for example, be a carrier that is pulse modulated for a signal of two microseconds duration. This signal, if of low input level, is amplified in amplifier stage 12 and is further amplified in a second stage 14; and the signal thus amplified by cascaded stages 12 and 14 is demodulated in detector 16 for application to utilization device 18.

In the event that the input signal appearing at terminal 10 is of suitable level for detection and direct application to utilization device 18, it would, nevertheless, be applied to amplifiers 12 and 14; but in this process the inherent tendency of practical amplifier designs is to extend the pulse so that an input pulse of two microseconds might perhaps emerge after detection as a 2.5 microsecond pulse or a still longer pulse.

Associated with each amplifier stage, at its input, is a diversion channel. Channel 20 is associated with amplifier stage 12 and diversion channel 22 is associated with amplifier stage 14. These diversion channels are connected together at terminal and wire 24, and the common wire 24 is joined by channel 26 to channel 28 at the output of amplifier stage 14, both channels 26 and 28 being connected at output 29 of the cascaded amplifiers to the utilization device. Channels 20, 22 and 28 each includes a detector because the input signal at terminal 10 is in this instance a pulse modulated carrier. Thus, channel 20 includes a detector 30, and channel 22 includes a detector 32, while channel 28 includes a detector 16 mentioned above. Each detector includes an output filter having in this illustration a load resistor 31 and a shunt capacitor 33. In the event that the amplifiers were to be used for demodulated pulses, the several detectors 30, 32 and 16 might be omitted. The effect of the several detectors shown is that the amplifier can more effectively translate abruptly varying signals where these are at carrier level than would be the case for amplifying pulses as such, separated from any carrier. Furthermore, the selectivity of the system is superior in the form of circuit shown, and the detectors are more effective when operating on an adequately amplified signal.

Associated with each signal diversion channel 20 and 22, is a switch 34 and 36, respectively. The pulse signals appearing in each channel are effective if sufficiently strong for utilization device 18 to disable the succeeding channel. Thus, if a signal is sufficiently intense in channel 22, for utilization device 18, this signal reaches the utilization device by way of common channel 26; and such signal is applied to switch 36, whose effect is to interrupt channel 28. Occasionally, channel 20 may transmit a sufficiently intense signal to utilization device 18 (by virtue of other cascaded amplifier stages not shown) without relying on amplifier stages 12 and 14; and in that event, the pulse appearing in channel 20 is effective with switch 34 to block signals appearing in channel 22; and the signal transmitted via channel 20 to point 24 is effective in switch 36 to block signals appearing in channel 28.

The pulses being considered may be either rectangular in form or they may be of somewhat sloping leading edges. In any event, it is desirable for the transmission characteristics of each switch 34 and 36 to be slightly faster than the transmission characteristic of amplifiers 12 and 14. This result is achieved by proper correlation of the bandwidths of the amplifiers with the time constants of the switches or by deliberately including suitable delay devices in amplifier stages 12 and 14; or both bandwidth factor and delay characteristics may be utilized for this result, as will be understood by those skilled in the art.

In a diagram, a series of rectifiers appears in the several signal channels, polarized alike so as to be forward-conducting and to block reverse transmission of signals of like polarity. (In the convention used in the drawings the triangle, as part of each rectifier symbol, corresponds to the cathode of a vacuum tube.) Rectifier 38 appears in channel 20, rectifier 40 appears in channel 22, rectifier 42 in channel 26 and rectifier 44 in channel 28. Switch 34 applies to rectifier 40 a voltage pulse whose polarity is such as to render this rectifier non-conductive under appropriate conditions of input signal level. On the other hand, if channel 22 is intended to transmit a pulse amplified in stage 12, this amplified pulse should not be reversely transmitted to the input of stage 12, and accordingly, rectifier 38 in channel 20 is effective for suppressing such reverse transmission. Similarly, rectifier 44 can be biased for suppressing signal transmission in channel 28 when suitably strong signals appear in either channel 20 or channel 22, and when neither channel 20 nor channel 22 transmits an effective signal and channel 28 is to be effective, rectifier 42 prevents reverse transmission of the pulses in channel 28 to the remaining lower level channels.

Rectifiers 40 and 44 form part of switches 34 and 36 respectively. These switches are of identical construction and, accordingly, only one of the switches and their effect on these rectifiers is here described. In switch 34, a cathode follower amplifier stage 46 is shown, whose function is to transmit the signal from channel 20, without loading that channel, to high gain stage 48.

Amplifier 48 is coupled to a cathode follower stage 50 through a pulse extending network including rectifier 52 in parallel with resistor 54, this rectifier and resistor being in the series connection by which amplifier 48 is coupled to cathode follower stage 50. The cathode follower stage and the wiring itself includes a shunt capacitance represented by capacitor 50′. This transmission path is instantly effective to apply the starting or leading edge of the pulse to the cathode follower stage 50; but because of the charge in capacitance 50′, the voltage at the grid of cathode follower 50 is sustained after the trailing edge of the pulse has passed via channel 20.

Between detector 32 and rectifier 40, at junction 53, a rectifier 55 is connected, being polarized oppositely to rectifier 40 as shown. In the absence of input signal pulses, positive bias is applied to rectifier 55 by way of resistor 56; and rectifier 55, because of its polarization, is blocked so long as rectifier 40 remains in conductive state. However, when a pulse of suitable strength is impressed on switch 34, the positive bias on rectifier 55 is nullified because of the output from cathode follower stage 50. Under such circumstances rectifier 55 is effective to bias rectifier 40 into a non-conductive state. Capacitor 58 is made suitably large for transmitting the pulses from cathode follower, but this capacitor is nonetheless effective to avoid loading the bias voltage applied to rectifier 55 under normal conditions in the absence of input signals.

Inadequately amplified signals appearing in channel 20 will not attain sufficiently amplified level at the output of cathode follower 50 to overcome the bias applied to rectifier 55 via resistor 56 and, consequently, rectifier 55 will remain essentially non-conducting and rectifier 40 will remain conducting. However, in the event that a sufficiently intense signal for utilization device 18 is impressed on channel 20, such signal when amplified in switch 34 is sufficiently negative to overcome the positive bias of rectifier 55 and thus to disable channel 22 and, via switch 36, to disable channel 28.

A strong signal may appear in channel 20, sufficient for utilization device 18 and adequate to block channel 22; and such signal is applied to the input end of switch 36 via diode 38. The effect is to block channel 28. Weak signals transmitted by channel 20 but sufficiently amplified by stage 12 will appear at point 24 for energizing switch 36 and for blocking channel 28. The switches are fast-acting so as to respond quickly to the start of each pulse, but the extended effectiveness of the switches suppresses even the trailing edges of pulses excessively amplified and hence extended in one or both of the stages 12, 14. In the event of a signal appearing in channel 20 which is just at the minimum level required for operating device 18, switch 34 will not block channel 22, and both the direct pulse via channel 20 and the amplified pulse via channel 22 might reach device 18. The difference between these two pulse levels is the latitude of signal to which device 18 should be responsive, and the gain of each amplifier 12, 14, should not exceed this factor. The concurrent transmission of a weak or a marginally effective signal together with an amplified signal is of no consequence, since the latter assumes control. Reverse transmission of amplified signals to lower level channels is blocked by rectifiers 38, 40, 42 and 44 which are biased by the higher-level signal into non-conductive state. These, it may be noted, are polarized alike and are properly conductive for transmitting the output of the rectifiers 30′, 32′, and 16′ in the several detectors.

It will be seen that rectifier 55 is blocked by the positive bias transmitted through resistor 56. This will be understood from a further consideration of the entire switch 34. If it be assumed that rectifier 30′ is conducting in such direction as to build up a positive voltage across resistor 31 in relation to ground, a positive pulse then appears at the grid and at the cathode of cathode follower 46; and this signal appears as a negative pulse at the anode of tube 48. The negative pulse is then transmitted in the forward direction of rectifier 52 (where the triangular part corresponds to the cathode of a vacuum tube) so that a negative pulse is then applied to the grid and to the cathode of cathode follower 50. This negative pulse is transmitted to, and through rectifier 55; and when so transmitted the negative pulse, applied to the portion of rectifier 40 which corresponds to the anode of a tube, blocks that rectifier.

Amplifiers 12 and 14 may be single stages, or each may represent a composite amplifying unit technically involving more than one "stage." The term stage is used in its larger sense of effecting gain over a certain range in what is effectively a single unit.

The embodiment described above is illustrative and will be recognized by those skilled in the art as subject to wide change in design and application; so that it is fitting for the appended claims to be interpreted broadly, consistent with the spirit and scope of the invention.

What is claimed is:

1. An amplifier for transmitting pulse signals of a wide range of input levels to a utilization device adequately responsive to only part of that range, including a plurality of amplifier stages connected to one another in cascade, the cascade being connected to a signal input point and to the utilization device, signal transmission channels between the input connection of each amplifier stage and the utilization device, and a switch connected to each of said transmission channels to be energized thereby and effective to disable the succeeding signal transmission channels in the amplifier in response to a signal of sufficient level for the utilization device.

2. An amplifier system, including an amplifier stage having an input end and an output end, an output signal transmission channel between the output end of said amplifier and an output point of the amplifier system, a diversion channel between the input end of said amplifier stage and the output point of the system, and a switch energized by said diversion channel and connected to block said transmission channel when signals exceeding a certain level are impressed on said input end.

3. An amplifier in accordance with claim 2, including blocking means in the diversion channel preventing signals passing through said transmission channel from being reversely transmitted via said diversion channel to the input end of said amplifier stage.

4. A pulse modulated signal amplifier including an amplifier stage having an input end and an output end, and having a diode detector in the output channel between the output end of said stage and an output point, a diversion channel between said input end of said stage and said output point, said diversion channel including a second diode detector, additional diodes between each detector and the output point, and means having input control connection to said diversion channel and output connection to the additional diode in said output channel for applying blocking bias to said additional diode when signals exceeding a predetermined level are impressed at said input end, said additional diode in said input channel being effective to block transmission of the detected signals in said output channel into said input channel.

5. Apparatus for amplifying signals to a predetermined narrow range of output levels from a wide range of input levels, including a succession of amplifiers connected in cascade between an input point and an output point, diversion channels connected between the input end of each of said amplifiers and said output point and a signal-amplitude detector connected for energization to the input point of any one amplifier and connected in control relation to the diversion channel at the output of said one amplifier for transmission of signals through the respective diversion channels only when the input to the respective amplifiers is less than a predetermined level.

6. Apparatus for amplifying signals to a predetermined narrow range of output levels from a wide range of input levels, including a succession of amplifiers connected in cascade between an input point and an output point, diversion channels connected between the output end of each of said amplifiers and said output point, and a disabling circuit energized by connection to the input point of each amplifier and in control relation to the diversion channel at the output of that amplifier for blocking transmission of that diversion channel whenever the signal level at the input of that amplifier attains a predetermined minimum.

7. An amplifier in accordance with claim 1 wherein said switch includes means prolonging the disabling effect thereof for a predetermined time beyond a given pulse.

8. An amplifier for transmitting pulse signals of a wide range of input levels to a utilization device adequately responsive to only part of that range, including a plurality of amplifier stages connected to one another in cascade, the cascade being connected to a signal input point and to the utilization device, signal transmission channels between the input connection of each amplifier stage and the utilization device, each channel including a rectifier, and a switch energized by the input of each amplifier stage and connected in control relation to the rectifier in the signal transmission channel at the output of that stage effective to bias the rectifier properly for signal transmission whenever the signal level at the input to that amplifier requires further amplification and being further effective to bias said rectifier into blocking condition whenever the input signal level to that amplifier reaches a suitable minimum level.

References Cited in the file of this patent

UNITED STATES PATENTS

| Number | Name | Date |
|---|---|---|
| 1,836,556 | Schelleng | Dec. 15, 1931 |
| 2,419,812 | Bedford | Apr. 29, 1947 |
| 2,496,551 | Lawson et al. | Feb. 7, 1950 |